US011199200B2

(12) United States Patent
Miyasaka (10) Patent No.: US 11,199,200 B2
(45) Date of Patent: Dec. 14, 2021

(54) ELECTRIC PUMP

(71) Applicant: SHINANO KENSHI CO., LTD., Ueda (JP)

(72) Inventor: Takeshi Miyasaka, Nagano (JP)

(73) Assignee: SHINANO KENSHI CO., LTD., Ueda (JP)

( * ) Notice: Subject to any disclaimer, the term of this patent is extended or adjusted under 35 U.S.C. 154(b) by 0 days.

(21) Appl. No.: 16/462,633

(22) PCT Filed: Feb. 7, 2018

(86) PCT No.: PCT/JP2018/004167
§ 371 (c)(1),
(2) Date: May 21, 2019

(87) PCT Pub. No.: WO2018/150969
PCT Pub. Date: Aug. 23, 2018

(65) Prior Publication Data
US 2020/0063740 A1    Feb. 27, 2020

(30) Foreign Application Priority Data
Feb. 14, 2017    (JP) .............................. JP2017-025334

(51) Int. Cl.
*F04D 29/58*    (2006.01)
*F04D 13/06*    (2006.01)
*F04D 29/42*    (2006.01)

(52) U.S. Cl.
CPC ......... *F04D 29/5813* (2013.01); *F04D 13/06* (2013.01); *F04D 29/42* (2013.01)

(58) Field of Classification Search
CPC .. F04D 13/06; F04D 13/0686; F04D 13/0693; F04D 25/06; F04D 25/068;
(Continued)

(56) References Cited

U.S. PATENT DOCUMENTS 4,773,829 A * 9/1988 Vettori ..................... H02K 7/14
                                                          310/68 R
2001/0036409 A1* 11/2001 Murata .................. H02K 11/33
                                                          417/32
(Continued)

FOREIGN PATENT DOCUMENTS

CN        109923317 A    6/2019
DE    102015114783 B3    9/2016
(Continued)

OTHER PUBLICATIONS

Apr. 24, 2018, Japanese Office Action issued in Japanese Patent Application No. 2017-025334.
(Continued)

*Primary Examiner* — Charles G Freay
*Assistant Examiner* — Chirag Jariwala
(74) *Attorney, Agent, or Firm* — Oliff PLC (57) ABSTRACT

An electric pump includes: a motor; an impeller rotated by the motor; a motor housing portion that houses the motor; an impeller housing portion that houses the impeller and is positioned at one side with respect to the motor housing portion in a rotation axis of the motor; an introduction pipe portion that introduces a fluid into the impeller housing portion and is positioned at the one side with respect to the motor housing portion; a discharge pipe portion that discharges the fluid from the impeller housing portion; a printed circuit board electrically connected to a coil of the motor and positioned at the one side with respect to the motor housing portion; and an electronic part mounted on the printed circuit board, wherein the printed circuit board includes a cutout portion and faces the impeller housing portion.

6 Claims, 5 Drawing Sheets

(58) Field of Classification Search
CPC ............. F04D 25/0693; F04D 29/5813; F04D 29/582; F04D 29/586
USPC .............................. 417/423.1, 423.7, 423.14
See application file for complete search history.

(56) References Cited

U.S. PATENT DOCUMENTS

| | | |
|---|---|---|
| 2008/0240947 A1 | 10/2008 | Allaire et al. |
| 2011/0254410 A1 | 10/2011 | Wakabayashi et al. |
| 2013/0028765 A1 | 1/2013 | Yokozawa et al. |
| 2015/0211548 A1 | 7/2015 | Bang et al. |
| 2016/0025095 A1 | 1/2016 | Hattori et al. |
| 2018/0238348 A1* | 8/2018 | Pawellek .............. F04D 29/624 |
| 2019/0234425 A1 | 8/2019 | Miyasaka |

FOREIGN PATENT DOCUMENTS

| | | | | |
|---|---|---|---|---|
| EP | 2903141 | A2 | | 8/2015 |
| EP | 3540239 | A1 | | 9/2019 |
| JP | 03111700 | A * | 5/1991 | ........... F04D 25/068 |
| JP | H03-111700 | A | | 5/1991 |
| JP | 11166500 | A * | 6/1999 | ......... F04D 13/0686 |
| JP | 2003-214377 | A | | 7/2003 |
| JP | 2004-068724 | A | | 3/2004 |
| JP | 2004-285888 | A | | 10/2004 |
| JP | 2004-316548 | A | | 11/2004 |
| JP | 2011-162054 | A | | 8/2011 |
| JP | 2013-047509 | A | | 3/2013 |
| JP | 2016-000960 | A | | 1/2016 |
| JP | 2016-003580 | A | | 1/2016 |
| JP | 2016-023635 | A | | 2/2016 |

OTHER PUBLICATIONS

Nov. 13, 2018, Japanese Office Action issued in Japanese Patent Application No. 2017-025334.
May 1, 2018 International Search Report issued in International Patent Application No. PCT/JP2018/004167.
Dec. 20, 2019 Extended European Search Report issued in European Patent Application No. 18754898.7.
May 1, 2018 Written Opinion of the International Searching Authority issued in International Patent Application No. PCT/JP2018/004167.
Nov. 12, 2020 Office Action issued in Chinese Patent Application No. 201880004694.2.
Oct. 1, 2021 Office Action issued in European Patent Application No. 18754898.7.

* cited by examiner

ELECTRIC PUMP

TECHNICAL FIELD

The present invention relates to an electric pump.

BACKGROUND ART

There is known an electric pump in which a motor rotates an impeller. In such an electric pump, an impeller housing portion housing the impeller is positioned at one side with respect to a motor housing portion housing the motor in a direction of a rotation axis of the motor, an introduction pipe portion introducing fluid to the impeller is positioned at one side with respect to the impeller housing portion, and a printed circuit board electrically connected to a coil of the motor is positioned at the other side of the motor housing portion (see, for example, Patent Documents 1 and 2).

PRIOR ART DOCUMENT

Patent Document

[Patent Document 1] Japanese Unexamined Patent Application Publication No. 2016-3580
[Patent Document 2] Japanese Unexamined Patent Application Publication No. 2016-23635

SUMMARY OF THE INVENTION

Problems to be Solved by the Invention

However, the arrangement of the printed circuit board at the above-mentioned position might increase the size of the electric pump in the rotation axis direction of the motor. In addition, since the coil of the motor is electrically connected to the printed circuit board and the printed circuit board is arranged near the coil, the printed circuit board and electronic parts mounted thereon might be increased in temperature.

The present invention has been made in view of the above problems and has an object to provide an electric pump that suppresses an increase in size in a direction of a rotation axis of a motor and suppresses an increase in temperature of a printed circuit board and an electronic part mounted thereon.

Means for Solving the Problems

The above object is achieved by an electric pump including: a motor; an impeller rotated by the motor; a motor housing portion that houses the motor; an impeller housing portion that houses the impeller and is positioned at one side with respect to the motor housing portion in a rotation axis of the motor; an introduction pipe portion that introduces a fluid into the impeller housing portion and is positioned at the one side with respect to the motor housing portion; a discharge pipe portion that discharges the fluid from the impeller housing portion; a printed circuit board electrically connected to a coil of the motor and positioned at the one side with respect to the motor housing portion; and an electronic part mounted on the printed circuit board, wherein the printed circuit board includes a cutout portion and faces the impeller housing portion.

Effects of the Invention

According to the present invention, it is possible to provide an electric pump that suppresses an increase in size in a direction of a rotation axis of a motor and suppresses an increase in temperature of a printed circuit board and an electronic part mounted thereon.

MODES FOR CARRYING OUT THE INVENTION

Figure 1A:
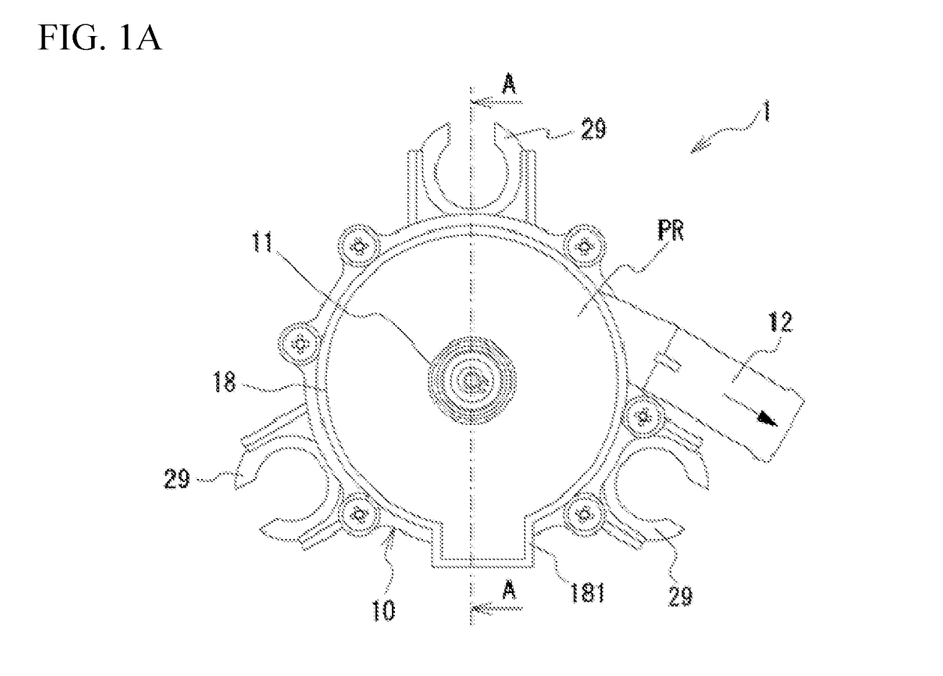
FIG. 1A is a top view of an electric pump.
Figure 1B:
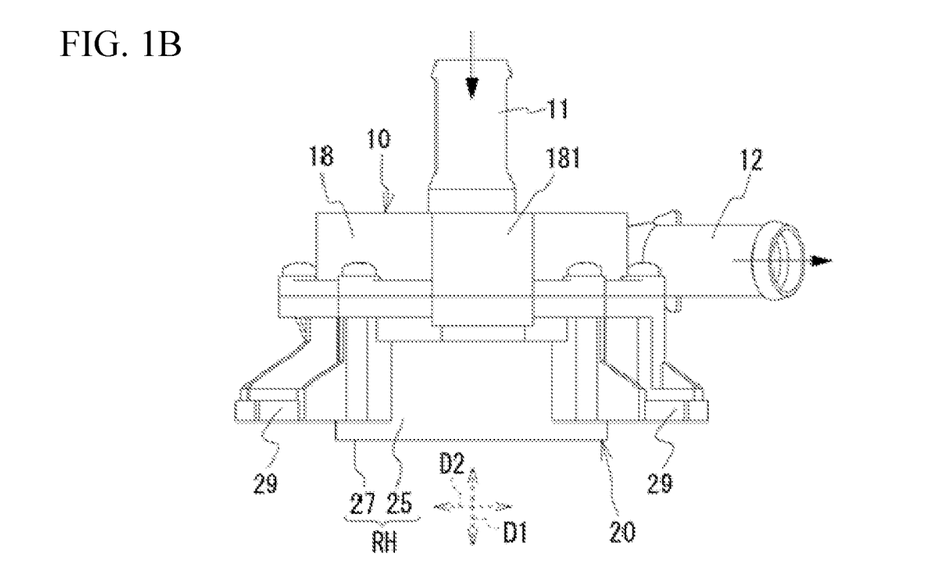
FIG. 1B is a side view of the electric pump.
Figure 2:
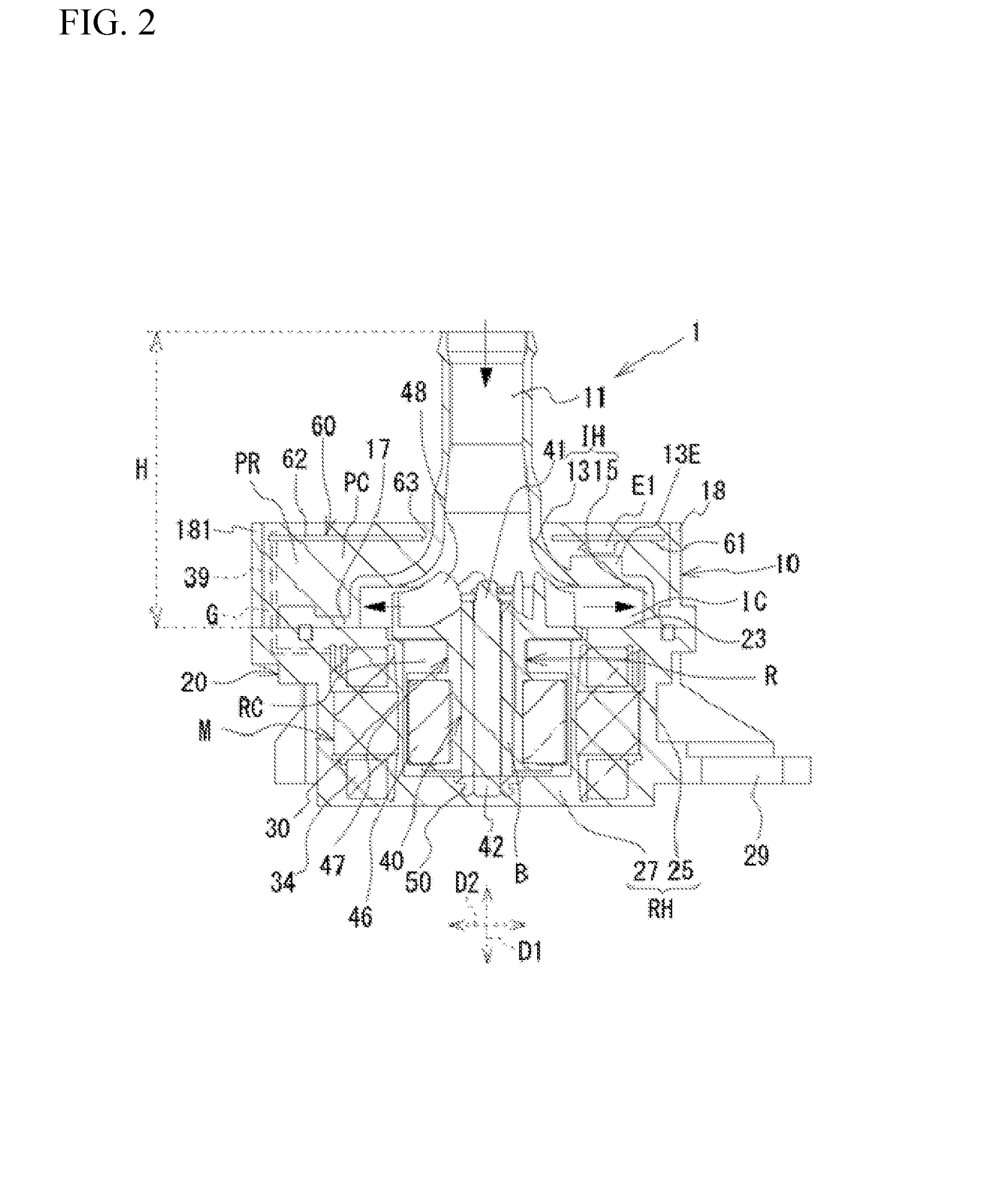
FIG. 2 is a cross-sectional view taken along line A-A of FIG. 1A.

FIG. 1A is a top view of an electric pump 1. FIG. 1B is a side view of the electric pump 1. FIG. 2 is a cross-sectional view taken along line A-A of FIG. 1A. The electric pump 1 includes cases 10 and 20 fixed to each other. In the case 20, a motor housing portion RH that houses the motor M is formed. The motor M includes a rotor R, an iron core 30, and a plurality of coils 34 wound around the iron core 30. The motor housing portion RH defines a rotor chamber RC in which the rotor R is rotatably housed. The rotor R includes an impeller portion 48 which will be described in detail later. The impeller portion 48 is housed in an impeller chamber IC defined by an impeller housing portion IH of the case 10. In addition, a printed circuit board 60 is electrically connected to the coils 34 via a conductive pin 39, and the printed circuit board 60 is arranged at the side of the case 10. On the printed circuit board 60, a driving circuit that controls energization states of the coils 34 to control the motor M is mounted. In addition, the case 10 is formed with an introduction pipe portion 11 that introduces fluid into the impeller housing portion IH and a discharge pipe portion 12 that discharges the fluid from the impeller housing portion IH. Specifically, the fluid is a liquid, but it may be a gas. The case 10 may be made of a metal such as aluminum or brass, or may be made of a synthetic resin with high thermal conductivity.

The case 20, having a substantially concave shape in cross section, includes: a peripheral wall portion 25 having a substantially cylindrical shape so as to surround the outer periphery of the rotor R; and a bottom wall portion 27 having a substantially plate shape and supporting the rotor R for rotation, and is made of, for example, synthetic resin. The peripheral wall portion 25 and the bottom wall portion 27 define the motor housing portion RH. The case 20 is insert molded with the iron core 30, a shaft member 40 supporting the rotor R for rotation, and a collar member 50 fixed to an end portion 42 of the shaft member 40. The iron core 30, the coils 34, and a part of the conductive pin 39 are buried in the peripheral wall portion 25. The end portion 42 of the shaft member 40 and the collar member 50 are buried in the bottom wall portion 27.

The rotor R includes: a holding member 47 rotatably supported via a bearing B fitted around the shaft member 40 described above; and a plurality of permanent magnets 46 held at a base end side of the holding member 47 and facing the peripheral wall portion 25 of the case 20. The impeller portion 48 that draws fluid from the introduction pipe portion 11 and discharges the fluid to the discharge pipe portion 12 is formed at a distal end side of the holding member 47. The impeller portion 48 is positioned at the side of an end portion 41 of the shaft member 40. Electric current flowing through the coils 34 excites the iron core 30 to have predetermined polarities, so that the magnetic force acting between the iron core 30 and the permanent magnets 46 causes the rotor R to rotate. Thus, the impeller portion 48 rotates. In this specification, the direction of the rotation axis of the motor M is referred to as an axial direction D1, and the radial direction of the motor M orthogonal to the axial direction D1 is referred to as a radial direction D2.

Additionally, the case 20 is provided with fixing portions 29 each having a substantially C-shape and protruding outwardly in the radial direction D2 from the peripheral wall portion 25. The fixing portions 29 each has a function for fixing the electric pump 1 to another member.

As illustrated in FIG. 2, the case 10 is fixed to the case 20 at one side with respect to the case 20 in the axial center direction D1, in particular, at the side where the impeller portion 48 is positioned. The case 10 is integrally formed with the introduction pipe portion 11, an upper wall portion 13, a peripheral wall portion 15, a fixed wall portion 17, and a surrounding wall portion 18. The introduction pipe portion 11 extends toward the case 20 in the axial direction D1. Also, the discharge pipe portion 12 is adjacent to the introduction pipe portion 11 and is positioned at the same side with respect to the case 20. The upper wall portion 13 curves from the introduction pipe portion 11 and extends outwardly in the radial direction D2. The peripheral wall portion 15 extends from the upper wall portion 13 toward the case 20 in the axial direction D1. The upper wall portion 13 and the peripheral wall portion 15 define the impeller housing portion IH. The fixed wall portion 17 extends outwardly in the radial direction D2 from the peripheral wall portion 15 and is fixed to an upper surface 23 of the case 20. The surrounding wall portion 18 is positioned outside the peripheral wall portion 15 in the radial direction D2 and stands from the fixed wall portion 17. The surrounding wall portion 18 has a substantially circular shape as illustrated in FIG. 1A, and is partially provided with a protruding wall portion 181 protruding outwardly in the radial direction D2.

The upper wall portion 13 is curved to increase its diameter toward the outer side in the radial direction D2 so as to correspond to the shape of the impeller portion 48 and faces the impeller portion 48 in the axial direction D1. The peripheral wall portion 15 is positioned outside the impeller portion 48 in the radial direction D2. Specifically, the impeller chamber IC is defined by the impeller housing portion IH of the case 10 and the upper surface 23 of the case 20.

A cutout portion 63 receiving the introduction pipe portion 11 is formed in the central portion of the printed circuit board 60. Further, the printed circuit board 60 faces the impeller housing portion IH and is arranged within a board chamber PC defined by the upper wall portion 13, the peripheral wall portion 15, the fixed wall portion 17, and the surrounding wall portion 18. The printed circuit board 60 has a surface 61 at the side of the motor housing RH and a surface 62 opposite to the surface 61. Most of electronic parts, such as an electronic part E1, mounted on the printed circuit board 60 and having a high height or requiring heat dissipation are mounted on the surface 61.

A part of the conductive pin 39 extends into the board chamber PC surrounded by the surrounding wall portion 18 and is connected to the printed circuit board 60. A potting resin PR is filled within the board chamber PC and is cured together with the printed circuit board 60, the electronic parts E1 to E3 described later, the conductive pin 39, and the like, so that these parts are sealed. This ensures waterproofness, dustproofness and external impact resistance of these parts. This also suppresses an increase in rattling of the printed circuit board 60 within the board chamber PC and suppresses an increase in noise at the time when the impeller portion 48 stirs liquid.

As illustrated in FIG. 2, the printed circuit board 60 is arranged within a range of a height H from the upper surface 23 of the case 20 to the upper end of the introduction pipe portion 11 in the axial direction D1. Specifically, the printed circuit board 60 is arranged in the vicinity of the impeller housing portion IH and faces the impeller housing portion IH and the introduction pipe portion 11. This suppresses an increase in size of the electric pump 1 in the axial direction D1.

Further, since the fluid flows through the impeller chamber IC and the introduction pipe portion 11, heat can be transferred from the printed circuit board 60 and the electronic parts E1 to E3 to the fluid via the potting resin PR, the upper wall portion 13, and the like. It is thus possible to suppress an increase in temperature of the printed circuit board 60 and the electronic parts E1 to E3 mounted thereon and described later in detail. Further, since the cutout portion 63 for receiving the introduction pipe portion 11 is formed in the printed circuit board 60, the printed circuit board 60 can be arranged closely to the impeller housing portion IH as much as possible. As a result, heat can be efficiently transferred from the printed circuit board 60 and the electronic parts E1 to E3 to the fluid flowing through the impeller chamber IC. This further suppresses the increase in temperature of the printed circuit board 60 and the electronic parts E1 to E3.

Figure 3A:
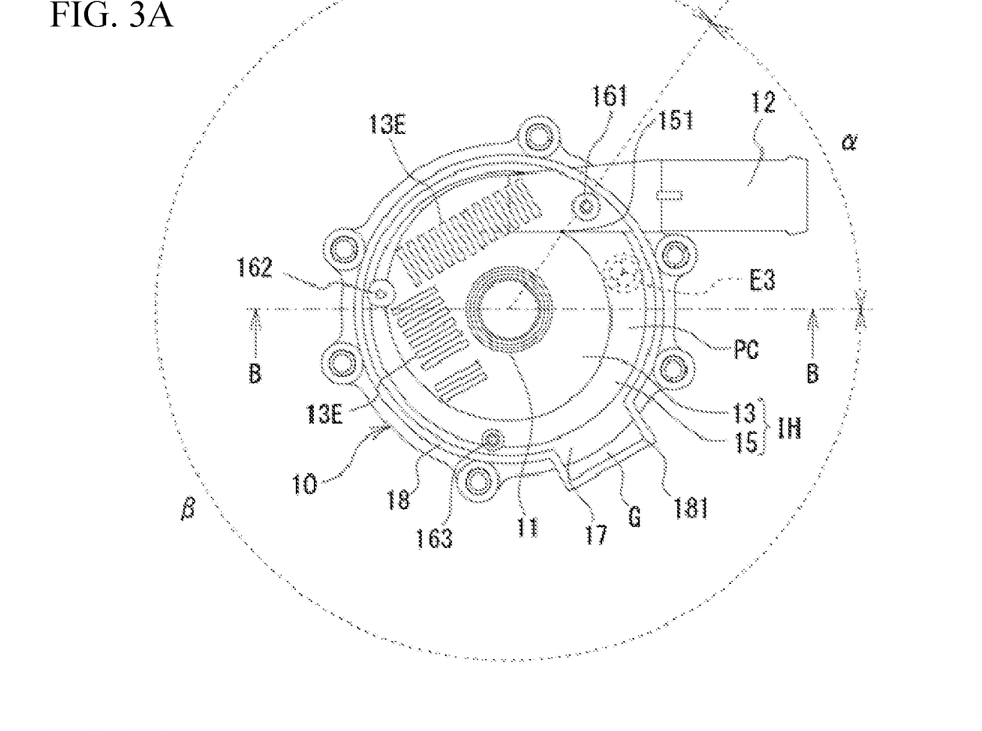
FIG. 3A is a top view of a case.
Figure 3B:
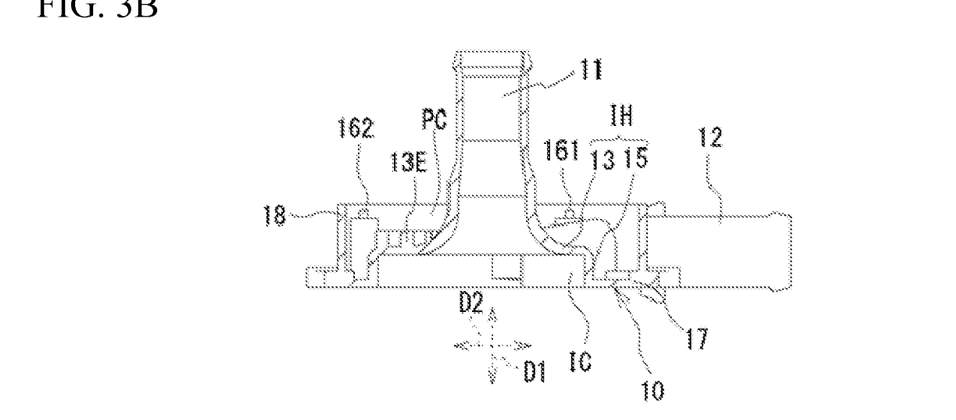
FIG. 3B is a cross-sectional view taken along line B-B of FIG. 3A.
Figures 4A, 4B:
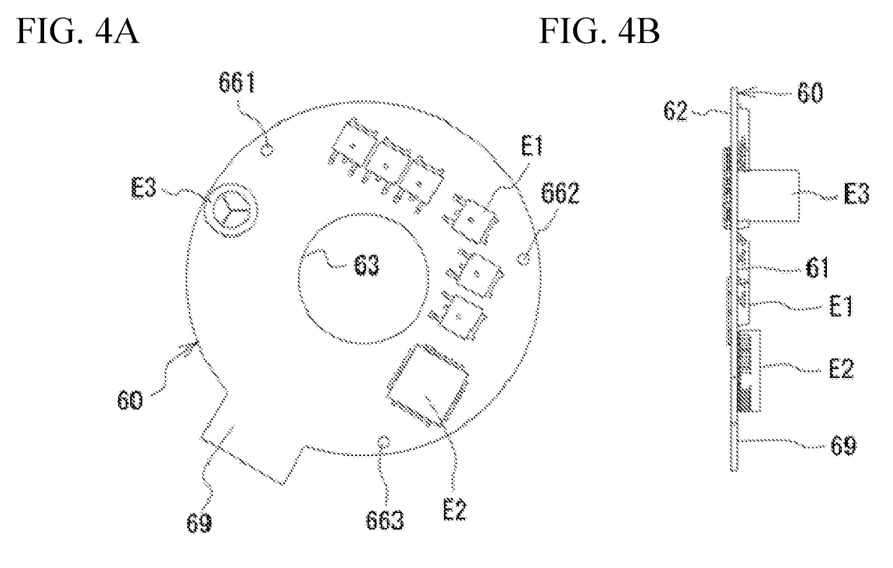
FIG. 4A is a bottom view of a printed circuit board.
FIG. 4B is a side view of the printed circuit board.

Next, the structure of the printed circuit board 60 will be described in detail. FIG. 3A is a top view of the case 10. FIG. 3B is a cross-sectional view taken along line B-B of FIG. 3A. FIGS. 3A and 3B illustrate only the case 10 before the printed circuit board 60 is assembled thereinto. When viewed in the rotation axis of the motor M as illustrated in FIG. 3A, the impeller housing portion IH has such a spiral shape that its diameter about the rotation axis of the motor M gradually increases in the clockwise direction from a spiral start point 151 where the discharge pipe portion 12 and the peripheral wall portion 15 are connected to each other. However, the impeller housing portion IH may have a circular shape. The discharge pipe portion 12 extends outwardly from the impeller housing portion IH and extends outwardly from the inside of the surrounding wall portion 18. FIG. 4A is a bottom view of the printed circuit board 60. FIG. 4B is a side view of the printed circuit board 60. On the surface 61 of the printed circuit board 60, a plurality of the electronic parts E1 to E3 with different heights are mounted. The electronic parts E1 to E3 such as a transistor, a capacitor, and a coil are provided for driving the motor M. As illustrated in FIG. 4B, the electronic part E1 is the lowest, and the electronic part E3 is the tallest, among the electronic parts E1 to E3. The electronic parts E1 and E2 face the upper wall portion 13 of the impeller housing portion IH in the axial direction D1. The electronic part E3 faces the peripheral wall portion 15 of the impeller housing portion IH in the radial direction D2. Further, the printed circuit board 60 has a connector portion 69 protruding outwardly in the radial direction D2 from a substantially circular portion. The distal end of the conductive pin 39 is connected to the connector portion 69.

Three holes 661 to 663 are formed in the vicinity of the outer edge of the printed circuit board 60. As illustrated in FIG. 3A, three support pins 161 to 163 extending in the axial direction D1 and arranged at substantially equal intervals about the axis are provided and are surrounded by the surrounding wall portion 18. The support pins 161 to 163 are respectively fitted into the holes 661 to 663, so the printed circuit board 60 is supported by the support pins 161 to 163. The support pin 161 is formed on the discharge pipe portion 12. A support pin 162 is formed in the impeller housing portion IH, specifically, between the surrounding wall portion 18 and the peripheral wall portion 15. The support pin 163 is formed between the surrounding wall portion 18 and the peripheral wall portion 15 but is close to the surrounding wall portion 18 and distant from the peripheral wall portion 15. The support pins 161 and 162 are examples of board supporting portions.

In addition, a plurality of support ribs 13E protruding to one side in the axial direction D1 and supporting the electronic parts E1 and E2 are provided on a part of the upper wall portion 13 and the discharge pipe portion 12. The support rib 13E is an example of a part supporting portion. The plurality of support ribs 13E are arranged substantially in parallel but are not limited to such a shape. For example, the support rib 13E may have a cylindrical shape or a prismatic shape. Here, a temperature of the electronic parts E1 to E3 for driving the motor M is generally higher than a temperature of the fluid flowing in the impeller chamber IC. Therefore, the fluid flowing in the impeller chamber IC causes the support rib 13E to be maintained at a temperature lower than the temperature of the electronic parts E1 and E2. Accordingly, the electronic parts E1 and E2 can be cooled, and an increase in temperature of the electronic parts E1 and E2 can be suppressed. In addition, silicon or heat dissipation sheet with a high thermal conductivity may be interposed between the electronic parts E1 and E2 and the support rib 13E.

Also, when the printed circuit board 60 is assembled into the case 10, the printed circuit board 60 can be stably supported by the support ribs 13E together with the support pins 161 to 163. This facilitates the operation of assembling the printed circuit board 60 into the case 10 and facilitates the operation of filling the potting resin PR into the board chamber PC.

A dotted line in FIG. 3A indicates a position where the electronic part E3 is arranged. The electronic part E3 that is the tallest among the electronic parts mounted on the printed circuit board 60 is arranged outside the peripheral wall portion 15 in the radial direction D2. This effectively prevents an interference between the electronic part E3 and the impeller housing portion IH and suppresses the increase in size of the electric pump 1 in the axial direction D1 while effectively utilizing a dead space. Further, as illustrated in FIG. 3A, the electronic part E3 is positioned within a range of α degrees, specifically, about 60 degrees, in the clockwise direction from the spiral start point 151. Here, although the peripheral wall portion 15 of the impeller housing portion IH gradually increases in diameter in the clockwise direction from the spiral start point 151, the diameter of the peripheral wall portion 15 is comparatively small within the above range. The tall electronic part E3 is arranged outside the region where the diameter of the peripheral wall portion 15 is small in the radial direction D2 in this way, so the increase in size of the electric pump 1 in the radial direction D2 is also suppressed. Further, not only the electronic parts E1 and E2 but also the electronic part E3 are mounted on the surface 61 of the printed circuit board 60 in the vicinity of the impeller housing portion IH, whereby the increase in temperature is suppressed.

As illustrated in FIG. 2, the conductive pin 39 has such a substantial L-shape as to extend outwardly in the radial direction D2 from the coil 34, to be bent in the middle thereof, and to extend toward the printed circuit board 60 in the axial direction D1. The distal end of the conductive pin 39 is connected to the connector portion 69 illustrated in FIG. 4A through a gap G between the protruding wall portion 181 and the fixed wall portion 17 illustrated in FIG. 3A. The connector portion 69 overlaps the gap G and is arranged to correspond to the protruding wall portion 181. The connector portion 69 is positioned outside the impeller housing portion IH in the radial direction D2. Likewise, the conductive pin 39 extends and is positioned outside the impeller housing portion IH in the radial direction D2. It is therefore possible to ensure the electrical conductivity between the conductive pin 39 and the printed circuit board 60 positioned at the same side with respect to the motor housing portion RH without the interference of the conductive pin 39 with the impeller housing portion IH. In addition, the connector portion 69 is positioned to recede from the discharge pipe portion 12 and the electronic parts E1 to E3, whereby the electrical conductivity of the conductive pin 39 is ensured without interfering with the discharge pipe portion 12 and the electronic parts E1 to E3.

As illustrated in FIG. 3A, the gap G, that is, the connector portion 69 is positioned in the range from α degrees to β degrees in the clockwise direction from the spiral start point 151 about the rotation axis of the motor M, specifically, about 60 degrees to 360 degrees, and the electronic part E3 is positioned in the range from the spiral start point 151 to about 60 degrees in the clockwise direction as described above. Thus, the electrical conductivity between the printed circuit board 60 and the coils 34 can be ensured without interfering with the conductive pin 39 and the electronic part E3. In addition, the conductive pin 39 is substantially L-shaped in cross-section, but not limited thereto. A conductive coil or another member may be used instead of the conductive pin 39. The conductive pin 39 is an example of a conductive member.

Further, all of the rotor R, the case 20, and the printed circuit board 60 can be assembled into from the same side to the case 10 in the electric pump 1. This improves the assembling workability of the electric pump 1.

In addition, the outer peripheral edge of the printed circuit board 60 is surrounded by the surrounding wall portion 18 defining the board chamber PC. Therefore, even before the board chamber PC is filled with the potting resin PR, an operator can handle the case 10 and the electric pump 1 without directly touching the printed circuit board 60. This also improves workability.

As illustrated in FIG. 2, the surrounding wall portion 18 surrounds at least a part of the introduction pipe portion 11 together with the printed circuit board 60. Specifically, the surrounding wall portion 18 surrounds a root portion of the introduction pipe portion 11 and the vicinity of a boundary between the introduction pipe portion 11 and the impeller housing portion IH. Further, as illustrated in FIG. 3A, the surrounding wall portion 18 surrounds a root portion of the discharge pipe portion 12 and the vicinity of a boundary between the discharge pipe portion 12 and the impeller housing portion IH. Thus, when an external impact is applied to the electric pump 1, the impact on the printed circuit board 60 can be suppressed, and the impact is also suppressed from being applied to the root portions of the introduction pipe portion 11 and the discharge pipe portion 12. This suppresses damage to the printed circuit board 60, the introduction pipe portion 11, and the discharge pipe portion 12.

In the above embodiment, the surrounding wall portion 18 surrounding the printed circuit board 60 is formed integrally in the case 10. Therefore, the number of parts is suppressed as compared with the case where the surrounding wall portion is formed separately from the case 10.

In the above embodiment, the potting resin PR is filled and cured within the board chamber PC, but the invention is not limited thereto. For example, a lid having a cutout portion for receiving the introduction pipe portion 11 may be attached to the case 10. In this case, like the above embodiment, the surrounding wall portion defining the board chamber PC may be formed integrally with the case 10 or the lid. With this arrangement, the outer periphery of the impeller housing portion IH is surrounded, so the noise from the impeller portion 48 can be suppressed.

In the above embodiment, the printed circuit board 60 is preferably close to the impeller housing portion IH in view of suppression of the increase in temperature, but it may be arranged within the height H illustrated in FIG. 2A. This is because the size increase in the axial direction D1 is suppressed.

The board supporting portion for supporting the printed circuit board may be provided only in the discharge pipe portion 12 or only in the upper wall portion 13. Likewise, the part supporting portion for supporting the electronic part may be provided only in the discharge pipe portion 12 or only in the upper wall portion 13.

In the above embodiment, as illustrated in FIGS. 2 and 3B, the upper wall portion 13 of the impeller housing portion IH in the axial direction D1 increases in height as it approaches the inner side from the outer side in the radial direction D2, that is, as it approaches the introduction pipe portion 11. Therefore, for example, a plurality of electronic parts having different heights may be mounted on the surface 61 of the printed circuit board 60, a low electronic part may be arranged close to the introduction pipe portion 11, and a tall electronic part may be arranged away from the introduction pipe portion 11 as compared with the low electronic part. As a result, the increase in size in the axial direction D1 is suppressed. Further, in this case, the tall electronic part may be arranged outside the impeller housing portion IH in the radial direction D2.

The peripheral wall portion 15 and the surrounding wall portion 18 may be achieved by a common wall portion. That is, a single peripheral wall portion may define the impeller housing portion IH and the board chamber PC.

Figure 5A:
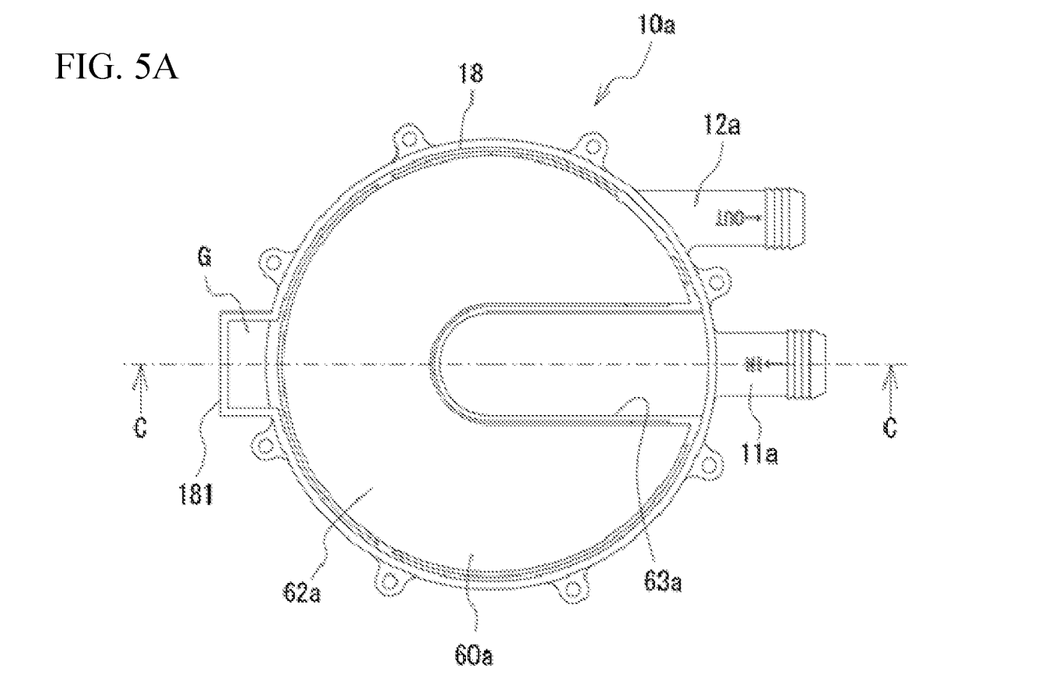
FIG. 5A is a top view of a case in a variation.
Figure 5B:
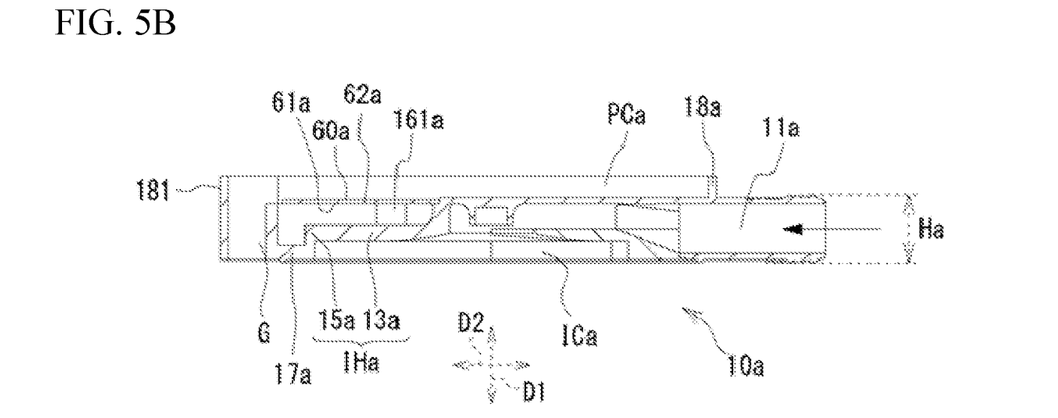
FIG. 5B is a cross-sectional view taken along line C-C of FIG. 5A.

Next, a case 10a according to a variation will be described. In the case 10a, the same or similar components of the above-described case 10 will be designated with the same or similar reference numerals, and a duplicated description thereof will be omitted. FIG. 5A is a top view of the case 10a according to a variation, and FIG. 5B is a cross-sectional view taken along line C-C in FIG. 5A. FIGS. 5A and 5B illustrate the case 10a before the case 10a is assembled into the case 20 and before a state where a board chamber PCa is filled with the potting resin PR.

An introduction pipe portion 11a extends outwardly in the radial direction D2 from an impeller chamber ICa and extends substantially in parallel with a discharge pipe portion 12a. In a printed circuit board 60a, a cutout portion 63a is linearly formed so as to recede the introduction pipe portion 11a. In addition, the impeller chamber ICa is flat compared to the impeller chamber IC described above. An upper wall portion 13a of an impeller housing portion IHa is also formed substantially parallel to the radial direction D2. The printed circuit board 60a is arranged within the board chamber PCa surrounded by the impeller housing portion IHa, a surrounding wall portion 18a, and the protruding wall portion 181. A height of a peripheral wall portion 15a in the axial direction D1 is smaller than that of the peripheral wall portion 15 described above. Like the fixed wall portion 17 described above, a fixed wall portion 17a is fixed to the case 20.

In such a configuration, the printed circuit board 60a is arranged within a range of a height Ha from the upper surface 23 of the case 20 to an upper end of the introduction pipe portion 11a in the axial direction D1, faces the impeller housing portion IHa and the introduction pipe portion 11a, and is arranged in the vicinity of the impeller housing portion IHa by the cutout portion 63a. It is thus possible to suppress the increase in size in the axial direction D1 and to suppress the increase in temperature of the printed circuit board 60a and the electronic parts mounted thereon. Further, as not illustrated in FIG. 5B, the number of the electronic parts mounted on a surface 61a of the printed circuit board 60a is larger than that of the electronic part mounted on a surface 62a. It is therefore possible to suppress the increase in temperature of the electronic parts. In addition, since a support pin 161a is formed in the upper wall portion 13a, the printed circuit board 60a can be stably supported, and workability is improved.

While the exemplary embodiments of the present invention have been illustrated in detail, the present invention is not limited to the above-mentioned embodiments, and other embodiments, variations and modifications may be made without departing from the scope of the present invention.

Although the printed circuit boards 60 and 60a each has a substantially circular shape, the present invention is not limited thereto. Also, the shapes of the cutout portions 63 and 63a are not limited to the illustrated examples. The electronic part may be mounted on the surface 62 as long as the number of the electronic parts mounted on the surface 61 of the printed circuit board 60 is larger than the number of the electronic parts mounted on the surface 62. The same applies to the printed circuit board 60a. In the above-described embodiment and variations, the arrangements of the printed circuit boards 60 and 60a themselves in the above way suppresses the increase in temperature thereof. Thus, even if there is an electronic part mounted on, for example, the surface 62, the increase in temperature of the electronic part is also suppressed. Further, in the above variation, the printed circuit board 60a may be arranged above the introduction pipe portion 11a.

The invention claimed is:

1. An electric pump comprising:
a motor;
an impeller rotated by the motor;
a motor housing portion that houses the motor;
an impeller housing portion that houses the impeller and is positioned at one side with respect to the motor housing portion along a rotation axis of the motor;
an introduction pipe portion that introduces a fluid into the impeller housing portion and is positioned at the one side with respect to the motor housing portion;
a discharge pipe portion that discharges the fluid from the impeller housing portion;
a printed circuit board electrically connected to a coil of the motor and positioned at the one side with respect to the motor housing portion; and
an electronic part mounted on the printed circuit board, wherein:

the printed circuit board includes a cutout portion and faces the impeller housing portion, the electronic part includes first and second electronic parts that differ from each other in height from the printed circuit board, the impeller housing portion is provided with first and second part supporting portions that respectively contact and support the first and second electronic parts, the first and second part supporting portions differ from each other in height from the impeller housing portion, the first part supporting portion is provided on a curved surface of the impeller housing portion that curves along a shape of the impeller, the first part supporting portion includes a plurality of support ribs, and the plurality of support ribs project from the curved surface.

2. The electric pump according to claim 1, wherein
the impeller housing portion is provided with a board supporting portion that supports the printed circuit board.

3. The electric pump according to claim 1, wherein
the electronic part further includes a third electronic part having a greater height than the first and second electronic parts, and the third electronic part is arranged outside a peripheral portion of the impeller housing portion in a radial direction.

4. The electric pump according to claim 1, wherein
the discharge pipe portion is positioned at the one side with respect to the motor housing portion.

5. The electric pump according to claim 4, wherein
the printed circuit board faces the discharge pipe portion, and the discharge pipe portion is provided with a third part supporting portion that supports the electronic part.

6. The electric pump according to claim 4, wherein
the printed circuit board faces the discharge pipe portion, and the discharge pipe portion is provided with a board supporting portion that supports the printed circuit board.

* * * * *